US009759996B2

(12) United States Patent
Horikoshi

(10) Patent No.: US 9,759,996 B2
(45) Date of Patent: Sep. 12, 2017

(54) PELLICLE FRAME AND PELLICLE

(71) Applicant: SHIN-ETSU CHEMICAL CO., LTD., Tokyo (JP)

(72) Inventor: Jun Horikoshi, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 154 days.

(21) Appl. No.: 14/791,896

(22) Filed: Jul. 6, 2015

(65) Prior Publication Data

US 2016/0062229 A1 Mar. 3, 2016

(30) Foreign Application Priority Data

Aug. 27, 2014 (JP) .................................. 2014-173211

(51) Int. Cl.
*G03F 1/62* (2012.01)
*G03F 1/64* (2012.01)

(52) U.S. Cl.
CPC . *G03F 1/64* (2013.01); *G03F 1/62* (2013.01)

(58) Field of Classification Search
CPC ..................................... G03F 1/62; G03F 1/64
USPC ............................................................. 430/5
See application file for complete search history.

(56) References Cited

U.S. PATENT DOCUMENTS

| 3,864,202 A * | 2/1975 | Loeb .................... C08G 61/025 206/471 |
| 4,657,805 A | 4/1987 | Fukumitsu et al. |
| 4,677,042 A | 6/1987 | Kato et al. |
| 4,861,402 A | 8/1989 | Gordon |
| 8,507,158 B2 * | 8/2013 | Murakami ................ G03F 1/64 430/5 |
| 2010/0273097 A1 | 10/2010 | Shirasaki |
| 2012/0122025 A1 | 5/2012 | Murakami et al. |

FOREIGN PATENT DOCUMENTS

| EP | 0 622 680 A2 | 11/1994 |
| JP | S55-102232 A | 8/1980 |
| JP | S58219023 A | 12/1983 |
| JP | S6327707 B2 | 6/1988 |
| JP | 2006184822 A | 7/2006 |
| JP | 2007333910 A | 12/2007 |
| JP | 4112649 B2 | 7/2008 |
| JP | 2009276521 A | 11/2009 |
| JP | 2010211021 A | 9/2010 |

OTHER PUBLICATIONS

Feb. 3, 2016 extended Search Report issued in European Patent Application No. 15002087.3.

* cited by examiner

*Primary Examiner* — Christopher Young
(74) *Attorney, Agent, or Firm* — Oliff PLC

(57) ABSTRACT

The present invention is directed to a pellicle frame of a pellicle for use in photolithography, comprising: a coating of a layer containing a para-xylylene-based polymer. The invention can inhibit release of sulfate ions, ammonium ions and so on from the pellicle frame and thereby reduce the occurrence of haze under exposure environment.

20 Claims, 1 Drawing Sheet

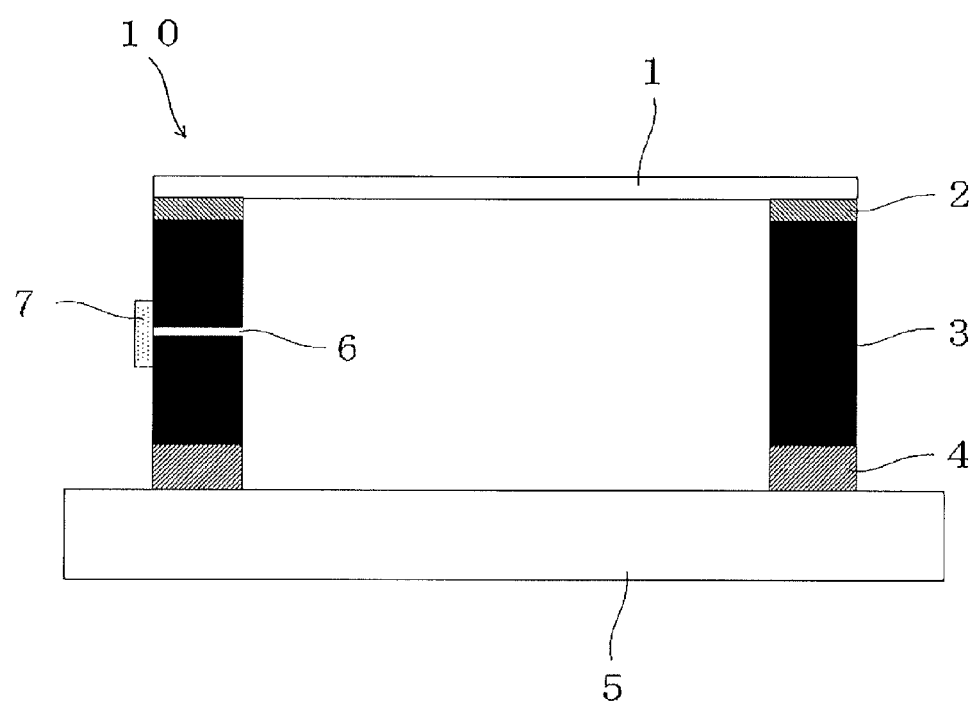

PELLICLE FRAME AND PELLICLE

BACKGROUND OF THE INVENTION

Field of the Invention

The present invention relates to a pellicle frame of a pellicle and the pellicle that are used as an extraneous-material cover for a photomask for use in lithography when a semiconductor integrated circuit such as an integrated circuit (IC) and large scale integration (LSI), or a liquid crystal display (LCD) is produced.

Description of the Related Art

In production of a semiconductor integrated circuit, such as IC and LSI, or a liquid crystal display, LCD, patterns are formed by photolithography involving an exposure process. If extraneous material is attached to an exposure plate (a photomask for use in lithography) used in this process, not only the patterns but also an image of the attached extraneous material is transferred by the exposure. This impairs the size, quality, and appearance of the patterns, thereby reducing production yield in the photolithography process.

In view of this problem, these operations are usually performed in a clean room. It is however difficult to always keep the exposure plate clean even in the clean room. Accordingly, an extraneous-material cover called a pellicle through which an exposure light readily passes is attached to the exposure plate. This method prevents direct attachment of extraneous material to the exposure plate and causes extraneous material to attach to a pellicle film. In this case, focus is adjusted to the pattern of the exposure plate in photolithography so that the transfer can be prevented from being affected by extraneous material on the pellicle film.

The pellicle is basically constructed of a pellicle film made of a material through which an exposure light readily passes, such as nitrocellulose, cellulose acetate or fluorine-based polymer, a pellicle frame made of stainless steel, polyethylene, or an aluminum alloy subjected to a black alumite process, an adhesive layer made of polybutene resin, polyvinyl acetate, acrylic resin, or silicone resin to attach the pellicle to the exposure plate, and a liner to protect the adhesive layer.

The pellicle film is stuck in such a way that a good solvent of the pellicle film is applied to the upper end surface of the pellicle frame, and the pellicle film is brought close contact with the pellicle frame, and then air-dried (See Patent Document 1), or in such a way as to use an adhesive such as acrylic resin, epoxy resin, or fluorine resin (See Patent Documents 2 and 3). The adhesive layer is formed on the lower end surface of the pellicle frame.

The reason why the aluminum alloy used for the pellicle frame is subjected to the black alumite process is to prevent the exposure light from being reflected by the pellicle frame and to facilitate inspection of extraneous material on the pellicle. In general, it is thus preferable to make the pellicle frame black.

The pellicle is mounted so as to cover a pattern region formed on a surface of the exposure plate. Since this pattern region covered by the pellicle is isolated from the exterior, the exposure plate can be prevented from directly contacting extraneous material such as dust produced in the exterior of the pellicle.

In recent years, the increasing scale of integration of LSI promotes shortening the wavelength of the source of exposure light. The mainstream source of the exposure light is thereby being shifted from G-line (436 nm) or I-line (365 nm) of a mercury lamp to a KrF excimer laser (248 nm) or an ArF excimer laser (193 nm).

The shortened wavelengths of the source of exposure light, however, increases the energy of the exposure light, thereby increasing the possibility of occurrence of extraneous material called haze on a photomask substrate due to reaction of gaseous substances present in an exposure atmosphere.

Accordingly countermeasures are taken: for example, gaseous substances in the clean room are reduced as much as possible, a photomask is rigorously cleaned, or a pellicle made of a material that produces less gas is used.

However, even though the photomask is cleaned and the pellicle made of a material that produces less gas is used, the occurrence of haze on the photomask substrate cannot be completely prevented.

An anodized coating formed on a surface of an aluminum alloy used for the pellicle frame, for example, contains acidic components such as sulfuric acid, nitric acid, and organic acid. When these acidic components are separated from the anodized coating and react in a closed space between the pellicle and the photomask under exposure environment, a sulfur compound such as an ammonium sulfate are produced. The haze occurs due to this produced sulfur compound attached to the photomask substrate. The occurrence of the haze causes reduction in yield of semiconductor production.

A known method to inhibit the occurrence of haze is to remove acidic components from the anodized coating by ultrasonic cleaning the anodized pellicle frame in pure water (See Patent Document 4). In addition, there are proposed methods in which a polymer coating is formed by electrodeposition instead of the anodized coating (See Patent Document 5), or metal plating is performed (See Patent Document 6), or a colorless aluminum alloy is used (See Patent Document 7).

When aluminum subjected to the plating process instead of the black alumite process as disclosed in Patent Document 6 or the colorless aluminum alloy as disclosed in Patent Document 7 is used for the pellicle frame, however, the visibility in extraneous-material inspection becomes worse. A pellicle frame coated with a polymer colored with black pigment such as an iron oxide, a titanium dioxide, or carbon black, as disclosed in Patent Document 5, is undesirable from the viewpoint of particle generation.

CITATION LIST

Patent Literature

[Patent Document 1] Japanese Patent Application Publication No. S58-219023
[Patent Document 2] U.S. Pat. No. 4,861,402
[Patent Document 3] Japanese Examined Patent publication No. S63-27707
[Patent Document 4] Japanese Patent Application Publication No. 2006-184822
[Patent Document 5] Japanese Patent Application Publication No. 2007-333910
[Patent Document 6] Japanese Patent Application Publication No. 2010-211021
[Patent Document 7] Japanese Patent Application Publication No. 2009-276521

SUMMARY OF THE INVENTION

The present invention was accomplished in view of the aforementioned problems, and it is an object of the present invention to provide a pellicle frame and a pellicle that can inhibit release of sulfate ions, ammonium ions and so on from the pellicle frame and thereby reduce the occurrence of haze under exposure environment.

In order to accomplish the above object, the present invention provides a pellicle frame of a pellicle for use in photolithography, comprising: a coating of a layer containing a para-xylylene-based polymer.

Since the inventive pellicle frame is coated with a layer containing a para-xylylene-based polymer, the amount of substances that cause haze to occur, such as sulfate ions, ammonium ions, and so on released from the pellicle frame, can be reduced, and the occurrence of haze can be inhibited under exposure environment.

The para-xylylene-based polymer preferably contains a halogen derivative of poly-para-xylylene, particularly polychloro-para-xylylene.

Such a pellicle frame can reliably reduce the amount of substances that cause haze to occur, such as sulfate ions, ammonium ions, and so on released from the pellicle frame, and hence reliably inhibit the occurrence of haze under exposure environment.

The layer containing the para-xylylene-based polymer is preferably transparent in a visible region of light.

When the layer containing the para-xylylene-based polymer is transparent in the visible region of light, a pellicle that can inhibit reflection of an exposure light from the pellicle frame and is favorable for extraneous-material inspection can be obtained.

The layer containing the para-xylylene-based polymer is preferably formed by chemical vapor deposition.

The layer containing the para-xylylene-based polymer can thus be formed by chemical vapor deposition.

A base of the pellicle frame is preferably made of a black material.

When the base of the pellicle frame is made of a black material, a pellicle that can inhibit reflection of an exposure light from the pellicle frame and is favorable for extraneous-material inspection can reliably be obtained.

The base of the pellicle frame can be made of an aluminum alloy subjected to a black alumite process.

When the base of the pellicle frame is subjected to the black alumite process, a pellicle that can inhibit reflection of an exposure light from the pellicle frame and is favorable for extraneous-material inspection can more reliably be obtained.

Furthermore, the present invention provides a pellicle for use in photolithography, comprising: the inventive pellicle frame; and a pellicle film stretched on the pellicle frame.

The inventive pellicle can inhibit the occurrence of haze on a photomask substrate because the pellicle uses the inventive pellicle frame that enables the inhibition of the occurrence of haze under exposure environment.

The inventive pellicle frame is coated with a layer containing a para-xylylene-based polymer and can thereby reduce the amount of substances that cause haze to occur, such as sulfate ions and ammonium ions released from the pellicle frame, and hence inhibit the occurrence of haze under exposure environment.

In addition, the inventive pellicle can inhibit the occurrence of haze on a photomask substrate in photolithography because the pellicle uses the inventive pellicle frame that enables the inhibition of the occurrence of haze under exposure environment.

BRIEF DESCRIPTION OF THE DRAWINGS

FIG. 1 is a schematic view of an exemplary configuration of the inventive pellicle.

DETAILED DESCRIPTION OF THE PREFERRED EMBODIMENTS

An embodiment of the present invention will be described, but the present invention is not restricted to this embodiment.

As described previously, acidic components, such as sulfuric acid, nitric acid, and organic acid, are contained in an anodized coating formed on a surface of an aluminum alloy used for the pellicle frame. These components are separated from the anodized coating and react in a closed space between the pellicle and the photomask under exposure environment, thereby producing a sulfur compound such as an ammonium sulfate. The haze occurs due to the produced compound.

Accordingly, the present inventor diligently conducted studies to solve this problem, and consequently found that a pellicle frame coated with a layer containing a para-xylylene-based polymer enables a reduction in the amount of substances that cause the occurrence of haze, such as sulfate ions, ammonium ions, and so on released from the pellicle frame. The inventor thoroughly investigated the best mode of carrying out the invention and brought the invention to completion.

The invention will now be described below in detail with reference to the drawings.

FIG. 1 shows the configuration of the inventive pellicle 10. In the inventive pellicle 10, a pellicle film 1 is stretched on an adhesive 2 disposed on the upper end surface of a pellicle frame 3 coated with a layer containing a para-xylylene-based polymer.

In this pellicle, an adhesive layer 4 is usually formed on the lower end surface of the pellicle frame 3 so that the pellicle 10 is mounted on an exposure plate 5. In addition, a liner (not shown) is detachably attached to the lower end surface of the adhesive layer 4.

The pellicle frame 3 may be provided with a pressure adjustment hole 6. Providing the pressure adjustment hole 6 can eliminate the difference in pressure between the interior and the exterior of a closed space defined by the pellicle 10 and the exposure plate 5, thereby enabling the prevention of a bulge and a dent of the pellicle film 1.

In this case, a dust filter 7 is preferably attached to the pressure adjustment hole 6. This dust filter 7 can prevent extraneous material from entering the closed space defined by the pellicle 10 and the exposure plate 5 from the pressure adjustment hole 6.

An adhesive may be applied to the inner surface of the pellicle frame 3 to catch extraneous material remaining in the closed space defined by the pellicle 10 and the exposure plate 5.

It is to be noted that the size of the components of the pellicle may be the same as a normal pellicle such as a pellicle for use in lithography in production of semiconductor integrated circuits or large liquid crystal displays, and changed if necessary. The material of the components of the pellicle is not particularly limited and may be a known material.

The material of the pellicle film 1 is not particularly limited and preferably has a high transmissivity at wavelengths of a source of exposure light and high light-resistance. For example, an amorphous fluorine-based polymer, which is usually used for an excimer laser, is used as this material. Examples of the amorphous fluorine-based polymer include CYTOP (brand name of Asahi Glass Co., Ltd), Teflon (a registered trademark), and AF (brand name of DuPont). These polymers may be dissolved in a solvent as needed when used in production of the pellicle film 1. For example, these polymers can be dissolved properly in a fluorine solvent.

The method of stretching the pellicle film 1 on the pellicle frame 3 is not particularly limited and may be a known method.

The adhesive 2 used to stick the pellicle film 1 on the pellicle frame 3 may be an adhesive that is conventionally used.

Specific examples of this adhesive include an acrylic resin adhesive, an epoxy resin adhesive, a silicone resin adhesive, and a fluorine-based polymer adhesive such as a fluorine-contained silicone adhesive. Among these, the fluorine-based polymer is preferable.

A specific example of the fluorine-based polymer is CYTOP (brand name of Asahi Glass Co., Ltd). The adhesive 2 is diluted with a solvent if necessary and the resultant is applied to the upper end surface of the pellicle frame 3. In this case, the application method is brush application, spraying, automatic dispenser, or other methods.

The adhesive layer 4 used to mount the pellicle 10 on the exposure plate 5 may be formed of an adhesive double coated tape, a silicone adhesive, or an acrylic adhesive. The adhesive layer 4 is usually formed on the lower end surface of the pellicle frame. On the lower end surface of the adhesive layer 4, a liner is detachably attached.

Examples of the material of the liner include polyethylene terephthalate (PET), polytetrafluoroethylene (PTFE), tetra-fluoroetylene-perfluoroalkylvinylether copolymer (PFA), polyethylene (PE), polycarbonate (PC), polyvinyl chloride (PVC), and polypropylene (PP), but the invention is not particularly limited to these. A release agent such as a silicone release agent or fluorine release agent may be applied to the surface of the liner depending on the adhesion of the adhesive layer 4.

The base material of the inventive pellicle frame 3 is not particularly limited, provided the strength and the rigidity of the pellicle frame can be secured. Examples of this base material include aluminum, an aluminum alloy (JIS 5000, 6000, or 7000 series), iron, an iron alloy, ceramic (such as SiC, AlN, or $Al_2O_3$), ceramic-metal composite material (such as Al—SiC, Al—AlN, or Al—$Al_2O_3$), carbon steel, tool steel, stainless steel, and carbon fiber composite material. Among these, aluminum and an aluminum alloy is preferable from the viewpoint of the strength, rigidity, light weight, and cost.

The pellicle frame 3 may be subjected to an anodized process, a plating process, a polymer coating process, or a painting process. These process performed if necessary are not particularly limited.

The base of the pellicle frame is preferably made of a black material. The base of the pellicle frame that is made of a black material enables reliable acquisition of a favorable pellicle that can inhibit the reflection of the exposure light from the pellicle frame and make it easy to detect extraneous material in the extraneous material inspection.

If an aluminum alloy is used for the base material of the pellicle frame 3, then its surface is preferably roughened with stainless beads, glass beads, or Carborundum (a registered trademark), and preferably subjected to the black alumite process.

The base material of the pellicle frame that is subjected to the black alumite process enables highly reliable acquisition of a pellicle that can inhibit the reflection of the exposure light from the pellicle frame and is advantageous to the detection of extraneous material in the extraneous material inspection.

The inventive pellicle frame 3 is coated with the layer containing a para-xylylene-based polymer. An exemplary para-xylylene-based polymer contained in this layer is a polymer expressed by the following chemical formula (1). This poly-para-xylylene-based polymer may be a copolymer having two kinds or more of repeat units.

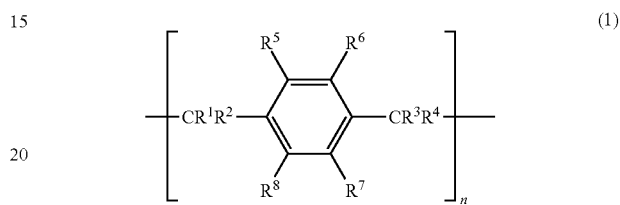

(1)

In the chemical formula (1), $R_1$ to $R_4$ represent a hydrogen atom or a halogen atom and may be identical or different; $R_5$ to $R_8$ represent a hydrogen atom, a halogen atom, or an alkyl group and may be identical or different; n represents a positive integer.

In the chemical formula (1), $R_1$ to $R_4$ is preferably a hydrogen atom or a fluorine atom and may be identical or different. $R_5$ to $R_8$ is preferably a hydrogen atom or a halogen atom and may be identical or different.

The contained halogen derivative of poly-para-xylylene, particularly poly-chloro-para-xylylene, as the para-xylylene-based polymer can reliably inhibit the pellicle frame from releasing sulfate ions and ammonium ions, so the occurrence of haze can be reliably inhibited under exposure environment.

The layer containing the para-xylylene-based polymer is preferably transparent in a visible region of light.

When the layer containing the para-xylylene-based polymer is transparent in the visible region of light, a pellicle that can inhibit the reflection of an exposure light from the pellicle frame and is favorable for extraneous-material inspection can be obtained.

Any conventional method may be used to form the para-xylylene-based polymer on the pellicle frame 3; the chemical vapor deposition (CVD) method is preferably used. The CVD method allows a uniform and minute layer of a para-xylylene-based polymer to be comparatively readily obtained.

More specifically, a solid of [2,2] paracyclophane and/or a derivative of [2,2] paracyclophane are placed on an evaporating furnace of an apparatus having the evaporating furnace, a pyrolizing furnace, and a vapor deposition chamber, and heated to 120° C. to 180° C. under a reduced pressure to evaporate. The evaporated [2,2] paracyclophane and/or the derivative of [2,2] paracyclophane flow into the pyrolizing furnace heated up to 650° C. to 700° C. and are pyrolyzed into monomers. These monomers enter the vapor deposition chamber at room temperature and are polymerized on the pellicle frame 3 disposed in the evaporating furnace. The layer of a para-xylylene-based polymer is thereby formed.

An example of the [2,2] paracyclophane and/or the derivative of [2,2] paracyclophane may be a compound expressed by the following chemical formula (2).

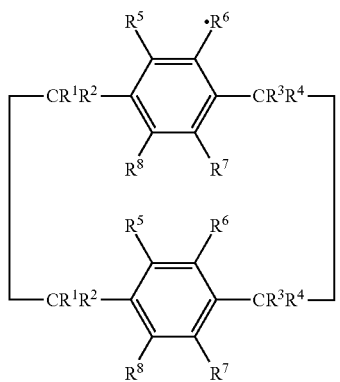

(2)

In the chemical formula (2), $R_1$ to $R_4$ represent a hydrogen atom or a halogen atom and may be identical or different; $R_5$ to $R_8$ represent a hydrogen atom, a halogen atom, or an alkyl group and may be identical or different.

The [2,2] paracyclophane and/or the derivative of [2,2] paracyclophane may be a known compound. The [2,2] paracyclophane and/or the derivative of [2,2] paracyclophane are commercially available. Examples of these include diX C, diX D, diX N, and diX F (KISCO Ltd.), Parylene N, Parylene C, Parylene D, and Parylene HT (Specialty Coating Systems Inc.).

The inventive pellicle constructed by using the pellicle frame coated with the layer containing a para-xylylene-based polymer can inhibit the release of sulfate ions, ammonium ions and so on from the pellicle frame and thereby reduce the occurrence of haze under exposure environment.

EXAMPLES

The present invention will be more specifically described below with reference to an example and comparative examples, but the invention is not limited to this example.

Example

Two frames made of an aluminum alloy (JIS A7075-T651) having a dimension of 149 mm×122 mm×5.8 mm and a thickness of 2 mm were prepared to be used as pellicle frames.

Both of the frames were provided with a 0.5 mm diameter vent at the center of their side surface. After the surfaces of these frames were cleaned, the surfaces of the frames were subjected to a roughening process for one minute by using glass beads under an air pressure of 1.5 kg/cm² with a sandblast.

After a subsequent cleaning process for 10 seconds in an NaOH cleaning liquid, a anodizing process was performed at a formation voltage of 10V (1.3 A) in a 14% sulfuric acid solution. Then, a black dyeing process and a sealing process were performed to form a black oxide film (black alumite) on the surfaces of the frames. The frames coated with the black oxide film were then cleaned for five minutes with an ultrasonic cleaning apparatus and pure water.

The entire surfaces of the anodized frames were coated with a layer of poly-chloro-para-xylylene by the CVD method (diX C coating) by using dichloro[2,2] paracyclophane as a coating material. The formed layer was colorless and transparent with a thickness of 5 μm.

One of the pellicle frames coated with the layer of poly-chloro-para-xylylene, together with 100 mL of pure water, was put into a polypropylene bag and heated at 90° C. for three hours. The 100 mL water (extracted water) put with the pellicle frame into the polypropylene bag was analyzed with an ion chromatography analyzer (2050i type by Dionex), Dionex IonPac ASA4A-SC column, to analyze ingredients dissolved from the frame.

The analysis result shown in Table 1 was obtained from the extracted water. The following ions were detected: 7.8 ppb of sulfate ions, 7.0 ppb of ammonium ions, 0.2 ppb of chloride ions, 0.1 ppb of sodium ions, 0.1 ppb of magnesium ions, and 0.1 ppb of calcium ions. It is to be noted that the amount of nitrate ions and phosphate ions was at or under the detection limit.

It is to be noted that Table 1 also shows the occurrence of haze, as described later, and the analysis result of dissolved ions and the occurrence of haze in the later-described comparative examples 1 and 2.

TABLE 1

| | | DISSOLVED ION (ppb) | | | | | | | | OCCURRENCE |
|---|---|---|---|---|---|---|---|---|---|---|
| | FRAME PROCESSING | Cl⁻ | NO₃⁻ | PO₄³⁻ | SO₄²⁻ | Na⁺ | NH₄⁺ | Mg²⁺ | Ca²⁺ | OF HAZE |
| EXAMPLE | BLACK ALUMITE + POLY-CHLORO-PARA-XYLYLENE | 0.2 | ND | ND | 7.8 | 0.1 | 7 | 0.1 | 0.1 | NONE |
| COMPARATIVE EXAMPLE 1 | BLACK ALUMITE | 11.7 | 17.5 | 41.3 | 1508 | 27.9 | 17.8 | 76.6 | 171 | EXIST |
| COMPARATIVE EXAMPLE 2 | BLACK ALUMITE + ACRYLIC RESIN | 0.8 | 4.4 | ND | 21.2 | 0.3 | 12.1 | ND | ND | EXIST |

ND: under detection limit

The inner surface of the other pellicle frame was coated with a silicone adhesive layer having a thickness of 1 μm with a spray coating apparatus.

A filter was disposed at a vent. The material of this filter was PTFE. The dimension of this filter was 9.5 mm in width, 2.5 mm in height, and 300 μm in thickness. The dust filter size was 0.1 μm to 3.0 μm. The filtration rate was 99.9999%. The filter had a dust filter and a chemical filter disposed outside the dust filter.

A silicone adhesive (a reticle adhesive) was applied to one end of this frame and heated at 100° C. for ten minutes to dry and harden this adhesive. Fluorine-based high polymer CTX (brand name of Asahi Glass Co., Ltd) diluted with a fluorine-based solvent, CT-SOLV 180 (brand name of Asahi Glass Co., Ltd), as a pellicle film adhesive, was applied to the other end of the frame, and heated at 100° C. for ten minutes to dry and harden this adhesive. A PET liner was attached to the reticle adhesive with a liner attaching apparatus.

The pellicle film, on the other hand, was produced in the following manner. First, Teflon (a registered trademark) AF 1600 (brand name of DuPont) was diluted with a fluorine-based solvent, Fluorinert FC-75 (3M INNOVATIVE PROPERTIES CO.) to prepare a solution with a concentration of 8%. Second, with this solution, a transparent film having a thickness of 0.8 µm was formed on a surface of a mirror-polished silicon substrate having a diameter of 200 mm and a thickness of 600 µm by a spin coater.

Finally, a frame for attachment having an external dimension of 200 mm×200 mm×5 mm (width) and a thickness of 5 mm was stuck to this film with an epoxy adhesive, Araldite Rapid (Showa Highpolymer Co., Ltd.), and detached in water.

This pellicle film was brought into close contact with the pellicle frame. The pellicle frame was heated with an IR rump to attach the film to the frame. At this time, the pellicle frame was fixed to a fixture with the attached surface facing upward, and a tension of 0.5 g/cm was applied to a portion of the film at the periphery of the pellicle frame by the frame for attachment.

With a cutter and a tube type of dispenser, the cutter was then moved along the periphery of the adhesive of the pellicle frame while Fluorinert FC-75 (brand name of DuPont) was dropped so as to cut and remove an unnecessarily portion of the outside of the pellicle frame.

The pellicle completed in the above manner was attached to a 6-inches quartz glass photomask substrate (reticle, cleaned such that the concentration of residual acidic components on the surface was 1 ppb or less) on which a Cr test pattern was formed.

The substrate with the pellicle was mounted on an ArF excimer laser scanner, NSR S306C (brand name of Nikon Corporation), a laser beam with a fluence of 500 J/cm$^2$ was emitted at 0.01 mJ/cm$^2$/pulse of exposure intensities on the reticle and a repetition frequency of 4000 Hz.

The photomask after the emission was observed with a laser inspection apparatus for extraneous material. As shown in Table 1, no haze occurred.

Comparative Example 1

The same two frames made of an aluminum alloy as the above example were prepared. After the surface cleaning, surface roughing, and NaOH cleaning processes were performed in the same manner as the example, the anodizing process was performed at a formation voltage of 10V (1.3 A) in a 14% sulfuric acid solution. The frames coated with a black oxide film were then cleaned for five minutes with an ultrasonic cleaning apparatus and pure water.

One of the cleaned pellicle frames, together with 100 mL of pure water, was put into a polypropylene bag and heated at 90° C. for three hours in the same manner as the example except that no coating of a poly-chloro-para-xylylene layer was formed. The extracted water was analyzed with an analyzer to analyze ingredients dissolved from this frame.

As shown in Table 1, the analysis result was that the following ions were detected: 1508 ppb of sulfate ions, 17.8 ppb of ammonium ions, 11.7 ppb of chloride ions, 17.5 ppb of nitrate ions, 41.3 ppb of phosphate ions, 27.9 ppb of sodium ions, 76.6 ppb of magnesium ions, and 171 ppb of calcium ions.

Since the frames were not coated with a layer of poly-chloro-para-xylylene in comparative example 1, all dissolved ions analyzed were detected with a higher concentration than the concentration in the above example.

As in the example, the inner surface of the other pellicle frame was then coated with a silicone adhesive; a filter was disposed at a vent; the pellicle film and others were provided to complete a pellicle.

As in the example, this pellicle was attached to a photomask substrate; an ArF excimer laser beam was emitted to the photomask and the photomask was then observed. As shown in Table 1, the observation revealed the occurrence of haze.

Comparative Example 2

The same two frames made of an aluminum alloy as the above example were prepared. After the surface cleaning, surface roughing, and NaOH cleaning processes were performed in the same manner as the example, a anodizing process was performed at a formation voltage of 10V (1.3 A) in a 14% sulfuric acid solution. The frames coated with a black oxide film were cleaned for five minutes with an ultrasonic cleaning apparatus and pure water.

The entire surfaces of the frames coated with the black oxide film were then subjected to electrodeposition with a solution of ELECOAT Frosty W-2 (made by SHIMIZU Co., Ltd.) at 25° C. to coat the surfaces with an acrylic resin layer with a thickness of 5 µm. The frames were then rinsed with pure water and heated in an oven at 200° C. for 30 minutes.

One of the pellicle frames coated with the acrylic resin layer, together with 100 mL of pure water, was put into a polypropylene bag and heated at 90° C. for three hours in the same manner as the above example. The extracted water was analyzed with an analyzer to analyze ingredients dissolved from this frame.

As shown in Table 1, the analysis result was that the following ions were detected: 21.2 ppb of sulfate ions, 12.1 ppb of ammonium ions, 0.8 ppb of chloride ions, 4.4 ppb of nitrate ions, and 0.3 ppb of sodium ions. It is to be noted that the amount of phosphate ions, magnesium ions, and calcium ions was at or under the detection limit.

Since the acrylic resin layer was formed on the black alumite in comparative example 2, the amount of dissolved ions was lower than the amount in comparative example 1. The sulfate ions and ammonium ions, however, were detected in a larger amount than the amount in the example.

As in the example, the inner surface of the other pellicle frame was then coated with a silicone adhesive; a filter was disposed at a vent; the pellicle film and others were provided to complete a pellicle.

As in the example, this pellicle was attached to a photomask substrate; an ArF excimer laser beam was emitted to the photomask and the photomask was then observed. As shown in Table 1, the observation revealed the occurrence of haze.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A pellicle frame of a pellicle for use in photolithography, comprising:
   a coating of a layer containing a para-xylylene-based polymer.

2. The pellicle frame according to claim 1, wherein the para-xylylene-based polymer contains a halogen derivative of poly-para-xylylene.

3. The pellicle frame according to claim 1, wherein the para-xylylene-based polymer contains poly-chloro-para-xylylene.

4. The pellicle frame according to claim 2, wherein the para-xylylene-based polymer contains poly-chloro-para-xylylene.

5. The pellicle frame according to claim 1, wherein the layer containing the para-xylylene-based polymer is transparent in a visible region of light.

6. The pellicle frame according to claim 2, wherein the layer containing the para-xylylene-based polymer is transparent in a visible region of light.

7. The pellicle frame according to claim 3, wherein the layer containing the para-xylylene-based polymer is transparent in a visible region of light.

8. The pellicle frame according to claim 4, wherein the layer containing the para-xylylene-based polymer is transparent in a visible region of light.

9. The pellicle frame according to claim 1, wherein the layer containing the para-xylylene-based polymer is formed by chemical vapor deposition.

10. The pellicle frame according to claim 8, wherein the layer containing the para-xylylene-based polymer is formed by chemical vapor deposition.

11. The pellicle frame according to claim 1, wherein a base of the pellicle frame is made of a black material.

12. The pellicle frame according to claim 10, wherein a base of the pellicle frame is made of a black material.

13. The pellicle frame according to claim 1, wherein a base of the pellicle frame is made of an aluminum alloy subjected to a black alumite process.

14. The pellicle frame according to claim 10, wherein a base of the pellicle frame is made of an aluminum alloy subjected to a black alumite process.

15. A pellicle for use in photolithography, comprising:
a pellicle frame according to claim 1; and
a pellicle film stretched on the pellicle frame.

16. A pellicle for use in photolithography, comprising:
a pellicle frame according to claim 12; and
a pellicle film stretched on the pellicle frame.

17. A pellicle for use in photolithography, comprising:
a pellicle frame according to claim 14; and
a pellicle film stretched on the pellicle frame.

18. A pellicle frame of a pellicle for use in photolithography, comprising:
a base of the pellicle frame, where the base is made of a base material; and
a coating; wherein
the coating comprises a layer containing a para-xylylene-based polymer, the para-xylylene-based polymer being in direct contact with an outer surface of the base material of the base of the pellicle frame.

19. A pellicle frame of a pellicle for use in photolithography, comprising:
a base of the pellicle frame, the base having an outer surface, and
a layer containing a para-xylylene-based polymer, the para-xylylene-based polymer being in direct contact with the outer surface of the base of the pellicle frame; wherein
the layer containing the para-xylylene-based polymer coats the entire outer surface of the base of the pellicle frame.

20. The pellicle frame according to claim 19, wherein a base material of the base of the pellicle frame is an aluminum alloy, and the outer surface of the base of the pellicle frame is a black oxide film.

* * * * *